United States Patent
Takashima

(10) Patent No.: US 10,961,622 B2
(45) Date of Patent: Mar. 30, 2021

(54) GAS BARRIER FILM AND METHOD OF MANUFACTURING THE SAME

(71) Applicant: TOPPAN PRINTING CO., LTD., Tokyo (JP)

(72) Inventor: Nao Takashima, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/149,509

(22) Filed: Oct. 2, 2018

(65) Prior Publication Data

US 2019/0032208 A1 Jan. 31, 2019

Related U.S. Application Data

(60) Division of application No. 15/684,312, filed on Aug. 23, 2017, now abandoned, which is a continuation of
(Continued)

(30) Foreign Application Priority Data

Feb. 26, 2015 (JP) .............................. JP2015-036374

(51) Int. Cl.
*C23C 16/455* (2006.01)
*B32B 9/00* (2006.01)
(Continued)

(52) U.S. Cl.
CPC .......... *C23C 16/45525* (2013.01); *B05D 1/60* (2013.01); *B05D 7/04* (2013.01);
(Continued)

(58) Field of Classification Search
CPC ............ C23C 16/45525; C23C 16/403; C23C 16/405; C23C 16/45536; C23C 16/545;
(Continued)

(56) References Cited

U.S. PATENT DOCUMENTS

| 6,413,645 | B1 | 7/2002 | Graff et al. |
| 2003/0203210 | A1 | 10/2003 | Graff et al. |

(Continued)

FOREIGN PATENT DOCUMENTS

| CN | 1968827 A | 5/2007 |
| EP | 2740593 A1 | 6/2014 |

(Continued)

OTHER PUBLICATIONS

International Search Report from International Patent Application No. PCT/JP2016/055783 dated May 17, 2016.
(Continued)

*Primary Examiner* — Robert S Walters, Jr.
(74) *Attorney, Agent, or Firm* — Foley & Lardner LLP

(57) ABSTRACT

A method of manufacturing a gas barrier film includes depositing an atomic layer deposition film on a surface of a plastic substrate to form a gas barrier laminate, using atomic layer deposition; depositing a curable resin layer on a support from which the layer is peelable, to form an overcoat laminate; laminating the overcoat laminate to the gas barrier laminate, with the atomic layer deposition film and the curable resin layer facing each other, and transferring the curable resin layer onto the atomic layer deposition film; curing the curable resin layer through application of heat or an active energy beam; and releasing the curable resin layer from the support.

12 Claims, 2 Drawing Sheets

Related U.S. Application Data application No. PCT/JP2016/055783, filed on Feb. 26, 2016.

(51) Int. Cl.
| | | |
|---|---|---|
| *B32B 38/18* | (2006.01) | |
| *C23C 16/40* | (2006.01) | |
| *C23C 16/54* | (2006.01) | |
| *B05D 1/00* | (2006.01) | |
| *B05D 7/04* | (2006.01) | |
| *B32B 27/08* | (2006.01) | |
| *B32B 37/14* | (2006.01) | |
| *B29C 71/02* | (2006.01) | |

(52) U.S. Cl.
CPC .............. *B32B 9/00* (2013.01); *B32B 27/08* (2013.01); *B32B 37/144* (2013.01); *B32B 38/18* (2013.01); *C08J 7/08* (2013.01); *C23C 16/403* (2013.01); *C23C 16/405* (2013.01); *C23C 16/45536* (2013.01); *C23C 16/545* (2013.01); *B32B 2307/422* (2013.01); *B32B 2307/7242* (2013.01); *B32B 2457/206* (2013.01); *C08J 2367/02* (2013.01)

(58) Field of Classification Search
CPC .... B05D 1/60; B05D 7/04; B32B 9/00; B32B 27/08; B32B 38/18; B32B 2307/422; B32B 2307/7242; B32B 2457/206; C08J 7/08; C08J 2367/02
See application file for complete search history.

(56) References Cited

U.S. PATENT DOCUMENTS

| | | | |
|---|---|---|---|
| 2004/0195967 A1 | 10/2004 | Padiyath et al. | |
| 2006/0065357 A1* | 3/2006 | Sikorski | B32B 38/04 156/259 |
| 2008/0182101 A1 | 7/2008 | Carcia et al. | |
| 2009/0011165 A1 | 1/2009 | Takahashi et al. | |
| 2009/0280333 A1* | 11/2009 | Kuwata | B32B 7/12 428/423.7 |
| 2011/0200836 A1* | 8/2011 | Obu | B32B 27/32 428/500 |
| 2011/0206900 A1 | 8/2011 | Iwase | |
| 2012/0003448 A1 | 1/2012 | Weigel et al. | |
| 2012/0227809 A1 | 9/2012 | Bharti et al. | |
| 2013/0009264 A1 | 1/2013 | Pankow et al. | |
| 2014/0130978 A1 | 5/2014 | Takahashi et al. | |
| 2014/0141218 A1* | 5/2014 | Yoshihara | C23C 16/403 428/213 |
| 2015/0064429 A1 | 3/2015 | Iwaya et al. | |
| 2015/0212350 A1 | 7/2015 | Niiyama et al. | |
| 2015/0243816 A1 | 8/2015 | Nachtigal et al. | |
| 2016/0009942 A1* | 1/2016 | Horiike | C23C 16/45555 428/216 |
| 2016/0214362 A1 | 7/2016 | Takahashi et al. | |
| 2016/0265111 A1* | 9/2016 | Horiike | B32B 27/302 |

FOREIGN PATENT DOCUMENTS

| | | |
|---|---|---|
| EP | 2740777 A1 | 6/2014 |
| EP | 3 081 375 A1 | 10/2016 |
| JP | 2005-178010 | 7/2005 |
| JP | 2005-178137 | 7/2005 |
| JP | 2007-090803 A | 4/2007 |
| JP | 2007-516347 A | 6/2007 |
| JP | 2011-173261 A | 9/2011 |
| JP | 2012-096432 A | 5/2012 |
| JP | 2012-182303 A | 9/2012 |
| JP | 2012-228859 A | 11/2012 |
| JP | 2013-502745 A | 1/2013 |
| JP | 2013-082106 | 5/2013 |
| JP | 2014-148753 A | 8/2014 |
| JP | 2015-003464 A | 1/2015 |
| WO | WO-2013/015417 A1 | 1/2013 |
| WO | WO-2014/028677 A1 | 2/2014 |
| WO | WO-2014/084686 A1 | 6/2014 |
| WO | WO-2014/123201 A1 | 8/2014 |
| WO | WO-2014/156888 A1 | 10/2014 |
| WO | WO-2014/208759 A1 | 12/2014 |
| WO | WO-2015/087949 A1 | 6/2015 |

OTHER PUBLICATIONS

European Patent Office. Extended European Search Report dated Oct. 5, 2018, in European Patent Application No. 16755679.4. 6 pages.
Chinese Office Action dated Feb. 26, 2019 in corresponding application No. 201680011244.7.
3M Polyester Protective Tape 1614, 2004.
International Search Report Issued in International Application No. PCT/JP2016/062112 dated Jul. 19, 2016.
Office Action dated Apr. 28, 2020 for corresponding Japanese Patent Application No. 2017-512597.
Partial European Search Report dated Dec. 11, 2018 in corresponding application No. 16780139.8.

\* cited by examiner

GAS BARRIER FILM AND METHOD OF MANUFACTURING THE SAME

CROSS-REFERENCE TO RELATED PATENT APPLICATIONS

This application is a divisional of U.S. application Ser. No. 15/684,312, filed on Aug. 23, 2018, which is a continuation application filed under 35 U.S.C. § 111(a) claiming the benefit under 35 U.S.C. §§ 120 and 365(c) of International Application No. PCT/JP2016/055783, filed on Feb. 26, 2016, which is based upon and claims the benefit of priority of Japanese Patent Application No. 2015-036374, filed on Feb. 26, 2015, the entireties of which are hereby incorporated by reference.

TECHNICAL FIELD

The present invention relates to a gas barrier film and a method of manufacturing the same. More particularly, the invention relates to a gas barrier film including a laminate having an atomic layer deposition film on a surface of a substrate formed of polymer material, and an overcoat layer formed on the atomic layer deposition film, and to a method of manufacturing the same.

BACKGROUND

Next-generation devices using organic semiconductor techniques are being developed and some are in practical use in fields such as of organic electroluminescent (EL) displays, organic EL lighting devices, organic solar cells, and electronic papers. Such devices include basic components elements which have an elaborate structure and are formed of material susceptible to external influences. The structure and material may deteriorate due to exposure to traces or extremely small traces of moisture or oxygen, which reduces the device's performance. To address this concern, for example, elements of an organic EL display are sandwiched between glass substrates so that they do not deteriorate. This structure is employed because the sealing technique shields the elements from air to great effect, and it ensures a high degree of moisture-proofing while allowing light transmission.

However, there is a demand for a flexible (thin, lightweight, unbreakable, and bendable) substrate formed of a plastic film, for the following reasons: the difficulty in handling a glass material, thickness and weight, and possible application to mobile devices whose markets are rapidly expanding. Additionally, such a substrate is required to have gas barrier properties, which prevent deterioration of the structure and material due to exposure to external moisture (vapor) and oxygen. The requirement for the gas barrier properties is that the moisture vapor transmission rate (MVTR) should be of the order of $10^{-5}$ [g/(m$^2$·day)], and a thickness, including a substrate film's thickness, should be some tens of micrometers. Transparent gas barrier films that meet these requirements are under investigation.

Such transparent gas barrier films have been developed and put to practical use largely in the field of packaging materials. Gas barrier films of packages for foods and pharmaceuticals have vapor barrier properties of the order of 1 to $10^{-2}$ [g/(m$^2$·day)], or better vapor barrier properties. Flexible gas barrier layers have been developed that conform to a substrate film and achieve high vapor barrier properties. Such gas barrier layers may be close-packed layers of inorganic materials formed on a thin plastic substrate film, or composite gas barrier layers that include a lamination of inorganic and organic materials to reduce the inorganic material's vulnerability to cracks for example. Such gas barrier layers can be formed using the following methods: Physical Vapor Deposition (PVD) and Chemical Vapor Deposition (CVD). With PVD, a substance is converted to its vapor phase, where it moves like gas at the atomic or molecular level, and is then condensed onto a surface of a substrate film.

Examples of PVD include vacuum deposition and sputtering. Sputtering, which provides a high-quality thin film having a uniform quality and thickness, has found widespread use. For example, this method is used in producing transparent electrode wiring films, electrode wiring films, or the like, for displays such as liquid-crystal displays, and a light reflection film or the like of an optical disc.

CVD is a method of growing a solid thin film by introducing a gas source into a vacuum chamber, and allowing one or more types of gas to decompose or react over a substrate using heat energy. Some types of CVD use a plasma or catalyst reaction to promote the reaction during film formation or reduce the reaction temperature. CVD using a plasma reaction is called plasma-enhanced CVD (PECVD), while CVD using a catalyst reaction is called Cat-CVD. These types of CVD reduce coating defects, and are thus used in, for example, a process for fabricating semiconductor devices (for example, a process of forming a gate insulating film).

Atomic layer deposition (ALD) has attracted attention as a method for achieving higher gas barrier properties. PTL 1 discloses an ALD technique used to deposit a gas transmission barrier layer on a substrate of material selected from the group consisting of plastics and glasses. ALD is a method of depositing layers one by one on a surface of a substrate film at the atomic level through chemical reaction of a substance adsorbed on the surface.

A preferable gas barrier layer is a continuous thin film coating of inorganic material with no defects. However, a substrate film may suffer from defects such as pinholes, due to flaws in the coating process or defects therein which impair its barrier properties. In PTL 1, an organic light-emitting polymer (OLEP) is formed on a flexible and permeable polyester substrate, and then a gas barrier layer is formed over the entire top and side surfaces of this light-emitting polymer using ALD. In PTL 1, such a gas barrier layer is used in an optically transparent gas barrier film to reduce the influence of the flaws and defects. Additionally, the gas barrier film of PTL 1 has a thickness of some tens of nanometers so that it can reduce gas permeability drastically compared to conventional gas barrier films.

PTL 2 discloses a gas barrier film that includes at least one inorganic barrier layer and at least one organic layer alternately formed on a plastic substrate. The inorganic barrier layer is formed using ALD. PTL 3 discloses a barrier film having a MVTR of $10^4$ [g/(m$^2$·day)] or less. Such a MVTR is necessary for barrier films of electronics to prevent elements vulnerable to moisture from deteriorating over a period of time. The barrier film of PTL 3 includes a substrate formed of a plastic film, and first and second barrier layers deposited on a surface and the opposite surface of the substrate using ALD. The first and second barrier layers are formed of inorganic material having vapor barrier properties.

CITATION LIST

Patent Literature

PTL 1: JP 2007-516347 A
PTL 2: JP 2007-090803 A

PTL 3: JP 2012-096432 A

In ALD, a highly active gas called a precursor (such as Tri-Methyl Aluminum (TMA); hereinafter such a precursor is referred to as first precursor), and a reactive gas (also called a precursor in ALD and thus hereinafter referred to as second precursor) are used alternately. Such gases are adsorbed on a surface of a substrate, followed by chemical reaction. In this way, thin layers are grown one by one at the atomic level.

The following describes in detail a method of forming a film using ALD.

1) After a single layer of precursor is adsorbed on a substrate, the unreacted precursors are discharged, as a result of a "self-limiting effect", where after a surface of the substrate is covered by a gas, no further gas is adsorbed on the substrate (first step).

2) A reactive gas is introduced into a chamber to oxidize or reduce the precursor to thereby form one layer of a thin film having a desired composition, followed by discharging the reactive gas (second step).

In ALD, the first and second steps are taken as one cycle, which is repeated to grow thin films on the substrate.

Accordingly, ALD grows two-dimensional thin films. Additionally, ALD has an advantage over the conventional vacuum deposition, sputtering, or CVD in that fewer coating defects occur.

Unlike other deposition techniques, ALD does not cause a shadowing effect, where sputtered particles obliquely incident on a surface of a substrate cause unevenness in a formed film. Thus ALD enables film formation as long as there is a gap into which a gas can enter. Therefore ALD is expected to be applied to coating of lines on or holes in a substrate having a high aspect ratio of height to width, or to micro-electro-mechanical systems (MEMS)-related technologies used for coating three-dimensional structures.

There is a variation of ALD where plasma is used for activating reactions in processes for decomposing a second precursor for reaction with a first precursor adsorbed on a substrate. This technique is called plasma-enhanced atomic layer deposition (PEALD).

Examples of substrates on which thin films can be formed using the above-described ALD include small plate-like substrates, such as wafers and photomasks, inflexible substrates with a large area, such as glass plates, and flexible substrates with a large area, such as film substrates.

Mass production equipment exists for forming thin films on such substrates using ALD. Such equipment can handle various substrates, depending on ease of handling, coating quality, and the like. Examples of such equipment include a single-wafer film deposition apparatus and a batch-type film deposition apparatus. With the single-wafer film deposition apparatus, a single wafer is fed into the apparatus, and a film is formed using ALD, following which the wafer is replaced with the next wafer, which will then be coated. This cycle is repeated. With the batch-type film deposition apparatus, a plurality of wafers are collectively set within the apparatus, and all the wafers are then coated uniformly.

An inline-type film deposition apparatus is used for forming a film on a glass substrate. With this apparatus, film formation is performed while substrates are successively conveyed to a section serving as the source of film formation.

Furthermore, a "roll-to-roll" web coating apparatus is used for forming flexible substrates. With this apparatus, a flexible substrate is unwound from a roll, film formation is performed while the substrate is being conveyed, and the substrate is wound onto another roller.

SUMMARY OF THE INVENTION

Technical Problem

An atomic layer deposition film formed using ALD is a thin film having a thickness of some nanometers to tens of nanometers, and has high barrier properties which achieve a moisture vapor transmission rate of the order of $10^{-5}$ [g/($m^2$·day)] as mentioned above. However, because of its extreme thinness, such an atomic layer deposition film is prone to surface scratches, which may extend down to the substrate; thus, it is known that the gas barrier properties of such films are easily impaired. None of PTLs 1 to 3 describe a gas barrier film that overcomes the vulnerability of such an atomic layer deposition film. With regard to the vulnerability, specifically, the atomic layer deposition film suffers from defects when its surface is subjected to mechanical stresses as applied by scratches or external pressures, such as a pressure in its thickness direction or a shearing pressure in the planar direction. The defects may lead to formation of a path for atmospheric gases to permeate there through and thus to flow between the atomic layer deposition film and the substrate, lowering the gas barrier properties and the adhesion strength between the substrate and the atomic layer deposition film.

Additionally, when the roll-to-roll web coating film deposition apparatus is used for forming a film on a plastic substrate, a laminate including an atomic layer deposition film may make contact with a roller while being conveyed, or the atomic layer deposition film may make contact with the plastic substrate, or when the laminate is taken up after film formation, the plastic substrate may make contact with a surface of a different atomic layer deposition film. Further, when the laminate is conveyed and stored around a roll, that is, in a rolled state, or when the laminate is processed into a gas barrier film, the laminate may suffer from defects due to external mechanical stresses, as described above. Accordingly, there remains a risk that the gas barrier properties may be impaired.

It is difficult to configure a film deposition line and a film deposition apparatus so that they are subject to no mechanical stresses. A major manufacturing problem arises if the laminate cannot be wound, and be conveyed and stored in a rolled state on the film deposition line.

The atomic layer deposition film can be protected from external mechanical stresses by forming an overcoat layer on a surface of the atomic layer deposition film of the laminate using a catalytic coating method. However, the catalytic coating method is unfavorable because the laminate may be subjected to mechanical stresses upon contact with, for example, a coating head during coating.

The inventors have discovered through research that laminating a protective film including an adhesive layer to the atomic layer deposition film prevents the gas barrier properties from being impaired. The cushioning properties of the adhesive layer eliminate or reduce external mechanical stresses on the atomic layer deposition film.

An object of the present invention is to provide a gas barrier film whose gas barrier properties are prevented from being impaired by eliminating or reducing external mechanical stresses on an atomic layer deposition film deposited on a plastic substrate, and a method of manufacturing the same. Another object of the present invention is to provide a gas barrier film whose adhesion strength between a plastic substrate and an atomic layer deposition film does not decrease, and a method of manufacturing the same.

Solution to Problem

According to a first aspect of the present invention, a method of producing a gas barrier film includes laminating an atomic layer deposition film to a surface of a plastic substrate using ALD to form a gas barrier laminate; laminating a curable resin layer onto a support from which the curable resin layer is peelable, to form an overcoat laminate; laminating the overcoat laminate to the gas barrier laminate, with the atomic layer deposition film and the curable resin layer facing each other, and transferring the curable resin layer onto the atomic layer deposition film; curing the curable resin layer through application of heat or an active energy beam; and releasing the curable resin layer from the support.

In the first aspect, the relationship $10\,t_a < t_{oc} < 200\,t_a$ may be satisfied, where $t_a$ is the thickness of the atomic layer deposition film, and $t_{oc}$ is the thickness of the curable resin layer.

In the first aspect, the curable resin layer may be released from the support before the curable resin layer is cured.

In the first aspect, the curable resin layer may have a Martens hardness of 50 N/mm².

In the first aspect, the curable resin layer may have a Martens hardness of 100 N/mm² to 300 N/mm² after being cured.

In the first aspect, the gas barrier laminate and the overcoat laminate may be in a rolled state, that is, in the form of a web, where they can be unwound continuously.

According to a second aspect of the present invention, a gas barrier film includes a plastic substrate, an atomic layer deposition film formed on a surface of the plastic substrate using ALD, and an overcoat layer formed of a cured curable resin layer and laminated to a surface of the atomic layer deposition film. The overcoat layer has a Martens hardness of 100 N/mm² to 300 N/mm².

Advantageous Effects of the Invention

According to the aspects of the present invention, an atomic layer deposition film formed on a plastic substrate has formed thereon an overcoat layer which has been formed of heat-curable resin or an active energy beam-curable resin by a transfer process. The overcoat layer serves as a protective layer that eliminates or reduces external mechanical stresses exerted on an atomic layer deposition film of a gas barrier film, and thus reduces the incidence of defects in the atomic layer deposition film. This configuration prevents the gas barrier properties of the gas barrier film from being impaired. With the overcoat layer formed by lamination of a curable resin layer through a transfer process, the curable resin layer and the overcoat layer cushion the atomic layer deposition film from mechanical stresses due to direct contact. This configuration reduces the incidence of defects in the atomic layer deposition film, resulting in a reduced impact on the gas barrier properties.

DESCRIPTION OF REPRESENTATIVE EMBODIMENTS

Embodiments of the present invention will now be described with reference to the accompanying drawings. It will be understood that the embodiments here described are intended as being representative of the present invention and that the present invention is not necessarily limited to the embodiments.

Figure 1A:
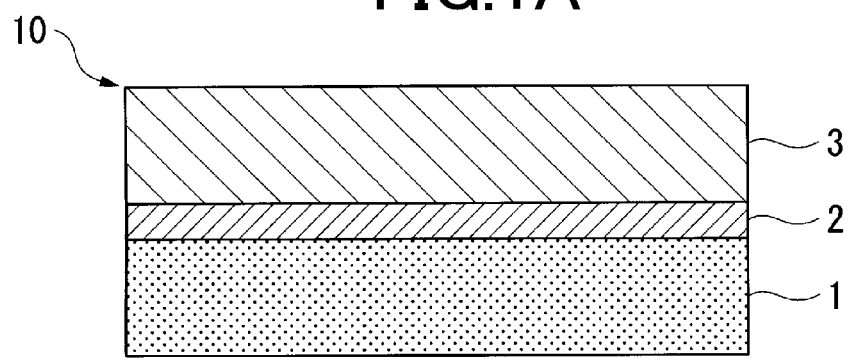
FIG. 1A is a schematic cross-sectional view of a gas barrier film according to an embodiment of the present invention.
Figure 1B:
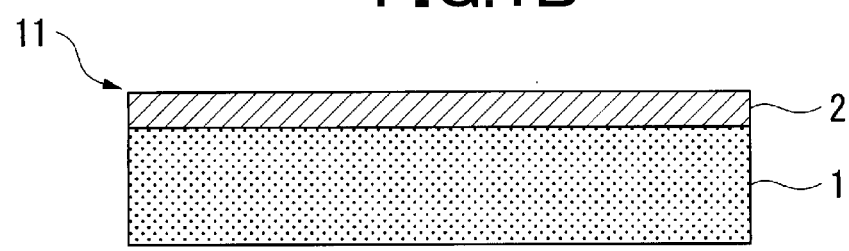
FIG. 1B is a schematic cross-sectional view of the gas barrier laminate according to the embodiment of the present invention.
Figure 1C:
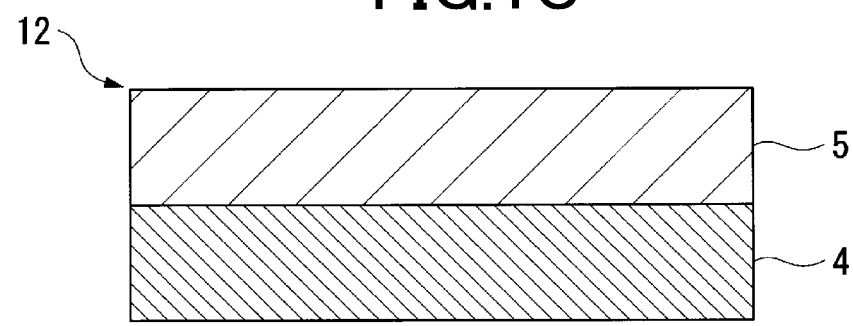
FIG. 1C is a schematic cross-sectional view of the overcoat laminate according to the embodiment of the present invention.

As shown in FIG. 1A, a gas barrier film 10 of the present embodiment includes a plastic substrate 1, an atomic layer deposition film 2 formed on a surface of the plastic substrate 1 using ALD, and an overcoat layer 3 formed on the atomic layer deposition film 2. As shown in FIG. 1B, a gas barrier laminate 11 of the present embodiment includes a plastic substrate 1, and an atomic layer deposition film 2 formed on a surface of the plastic substrate 1 using ALD. As shown in FIG. 1C, an overcoat laminate 12 of the present embodiment includes a curable resin layer 5 formed on a support 4. The curable resin layer 5 is formed of heat-curable resin or active energy beam-curable resin, and becomes an overcoat layer 3 when cured.

(Plastic Substrate 1)

Plastic substrate 1 is formed of a transparent plastic film. Examples of transparent plastic films useable in the present embodiment include polyester such as polyethylene terephthalate (PET) and polyethylene naphthalate (PEN), polyolefin such as polyethylene (PE) and polypropylene (PP), polyethersulfone (PES), polystyrene (PS), polyamide, polyvinyl chloride (PVC), polyvinyl alcohol (PVA), nylon-6, polycarbonate (PC), polyacrylonitrile, polyimide, aramid, triacetylcellulose (TAC), cyclo olefin polymer (COP), polymethyl methacrylate (PMMA), and biodegradable plastics, such as polylactic acid. Whether stretched or unstretched, these plastics can be used in the form of a web, and preferably have high mechanical strength and high dimensional stability.

For packaging materials, biaxially oriented polypropylene is preferable, considering heat resistance and dimensional stability; for a flat-panel display (FPD), such as a liquid-crystal display (LCD) and an organic EL display (OELD), that is required to have higher heat resistance and higher dimensional stability, polyethylene naphthalate (PEN), polyethersulfone (PES), polycarbonate (PC), or the like is preferable.

The plastic substrate 1 may include additives, such as antistatic agents, UV absorbers (UV inhibitors), plasticizers, lubricants, depending on application. For improved adhesion of an atomic layer deposition film to a surface of a deposited film, the surface may be previously subjected to corona treatment, low temperature plasma treatment, ion bombardment, chemical treatment, solvent treatment, or the like.

A plastic substrate of the present embodiment preferably has a thickness of, but not limited to, in the range of 25 μm or more to 200 µm, considering the production and processability of a gas barrier film. In the case where an atomic layer deposition film is deposited with a roll-to-roll film deposition apparatus for forming an atomic layer deposition film, the plastic substrate 1 is prepared in a rolled state, that is, in the form of a web, where it can be unwound continuously.

The atomic layer deposition film 2 is deposited on the plastic substrate 1 using atomic layer deposition (ALD). The atomic layer deposition film 2 may be formed of an inorganic oxide film of $AlO_x$, $TiO_x$, $SiO_x$, $ZnO_x$, $SnO_x$, or the like, an inorganic nitride film or inorganic oxynitride film of Al, Ti, Si, Zn, Sn, or the like, or a mixed film of these elements. The material to be deposited (deposition material) is selected according to the application or purpose.

Preferably, the atomic layer deposition film 2 has a thickness of 2 nm or more to 500 nm or less. In the case of application to organic EL displays, organic EL lighting devices, organic solar cells, or the like where high gas barrier properties are required, the atomic layer deposition film 2 preferably has a thickness of 10 nm or more.

According to the present embodiment, a process of depositing an atomic layer includes a step of adsorbing a first precursor on a surface of the plastic substrate 1, a step of purging surplus first precursor, a step of exposing the first precursor to a second precursor to allow the first precursor to react with the second precursor, and a step of purging surplus second precursor. This cycle is repeated a number of times.

If aluminum oxide (AlOx) is selected as a deposition material of an atomic layer deposition film, trimethylaluminum (TMA) may be used. The material constituting a first precursor to be used is selected, depending on a deposition material. In the case of titanium oxide (TiOx), titanium tetrachloride ($TiCl_4$) may be used. In the case of silicon oxide (SiOx), Tris(DiMethylAmido)Silane (3DMAS), bis (diethylamino)silane (BDEAS), or the like may be used.

The material constituting a second precursor is selected, depending on the deposition material. For example, when aluminum oxide is selected as the deposition material, water, ozone, and atomic oxygen are used. As a purge gas, an inert gas is introduced which is selected from nitrogen, helium, argon, and the like.

Figure 3:
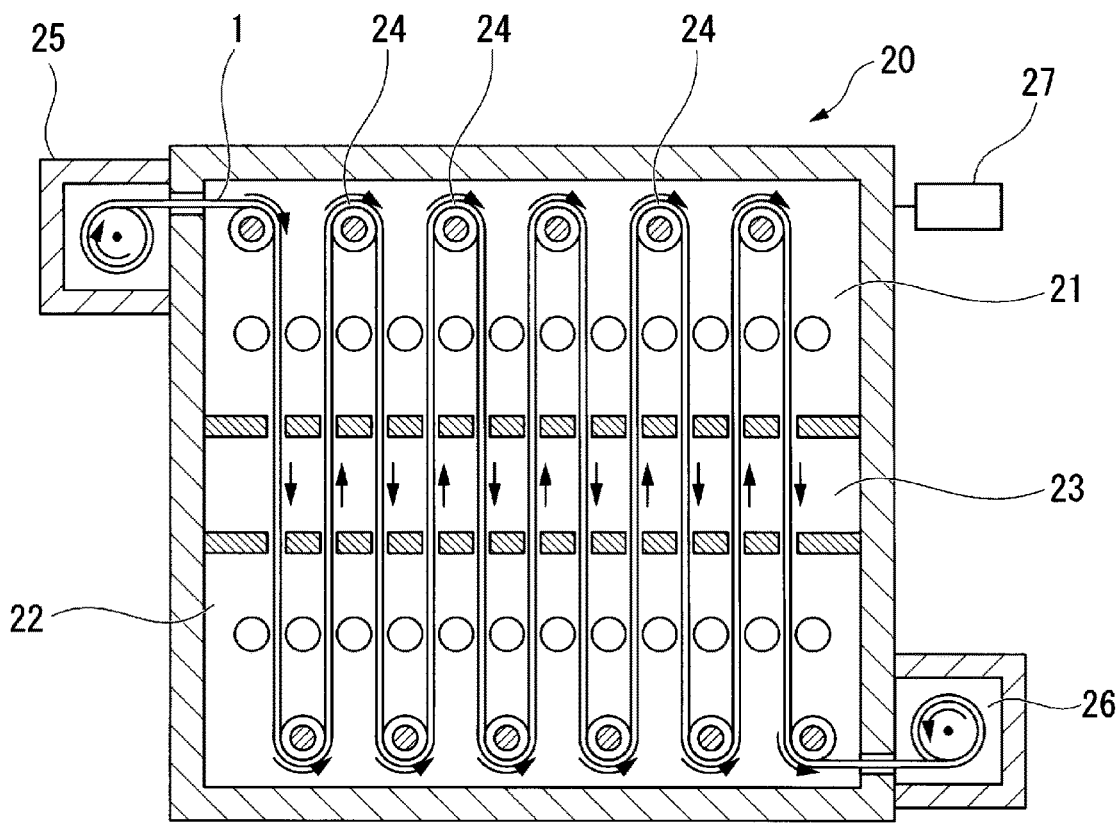
FIG. 3 is a diagram illustrating a film deposition apparatus for forming an atomic layer deposition film using ALD.

The process of depositing an atomic layer will now be described in connection with a film deposition apparatus 20 (shown in FIG. 3) for forming an atomic layer deposition film using ALD. The film deposition apparatus 20 is a take-up film deposition apparatus including a first vacuum chamber 21, second vacuum chamber 22, third vacuum chamber 23, and conveyor mechanism 24. A first precursor gas is introduced through a supply port (not shown) into the first vacuum chamber 21. A second precursor gas is introduced through a supply port (not shown) into the second vacuum chamber 22. A purge gas is introduced into the third vacuum chamber 23 via a supply port (not shown) through which a first precursor and a second precursor are discharged. The conveyor mechanism 24 includes a holder and conveys a first plastic substrate 1 into the first vacuum chamber 21, second vacuum chamber 22, and third vacuum chamber 23. The holder holds the both ends of the plastic substrate 1 in its width direction. The film deposition apparatus 20 takes up a plastic substrate 1 from a roll-out section 25, and deposits an atomic layer deposition film on the plastic substrate 1. The conveyor mechanism 24 conveys the first plastic substrate 1 into the first vacuum chamber 21 and into the second vacuum chamber 22, to complete one cycle. The plastic substrate 1 is alternately conveyed through the first and second vacuum chambers 21, 22 a number of times while an atomic layer is deposited on a surface thereof, to form a laminate 11. The laminate 11 is wound by a take-up section 26 in a rolled state. The vacuum chambers 21 to 23 have air outlets (not shown) that communicate with a vacuum pump 27, which serves as a section for a discharged gas. The vacuum pump 27 forces gases within the vacuum chambers 21 to 23 to be discharged via the air outlets.

This one cycle is repeated a number of times, so that an atomic layer deposition film of desired thickness is formed on a surface of the plastic substrate 1. While the cycle is repeated a number of times, the plastic substrate 1 is conveyed at the slowest speed. The speed of conveyance is determined from the time required for the exposure of the plastic substrate 1 within the first, second, and third vacuum chambers 21 to 23, and from the distance covered by the plastic substrate 1 when being conveyed through the vacuum chambers 21 to 23.

Figure 2:
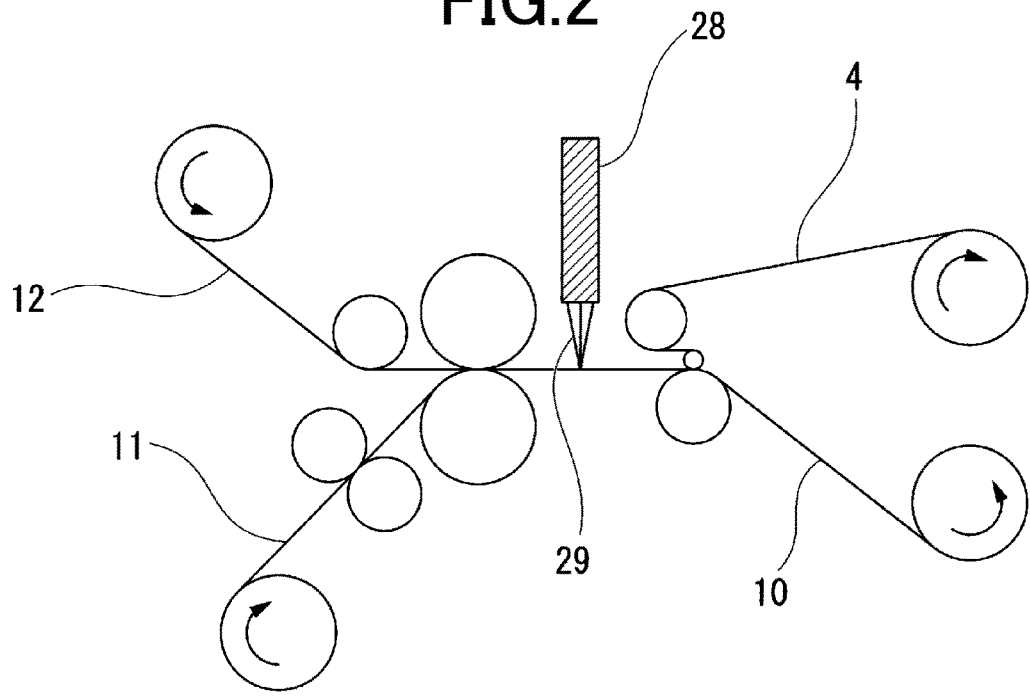
FIG. 2 is a diagram illustrating a process of forming an overcoat layer of a gas barrier film according to the embodiment of the present invention through a transfer process.

With reference to FIG. 2, a process for forming the overcoat layer 3 of the gas barrier film 10 will now be described.

The overcoat laminate 12 includes a curable resin layer 5 formed of uncured heat-curable resin or uncured active energy beam-curable resin, and a support 4 peelable from the curable resin layer 5. The overcoat laminate 12 is laminated to the atomic layer deposition film 2 so that the curable resin layer 5 of the overcoat laminate 12 faces the atomic layer deposition film 2 of the laminate 11. This structure allows the atomic layer deposition film 2 to be cushioned from mechanical stresses due to direct contact with a layer being deposited thereon. After the curable resin layer 5 is cured through application of heat or an active energy beam 29, the support 4 is released therefrom, and an overcoat layer 3 is formed on the atomic layer deposition film 2, to form a gas barrier film 10.

An overcoat laminate 12 including a curable resin layer 5 is laminated to a laminate 11 including an atomic layer deposition film 2 so that the atomic layer deposition film 2 and the curable resin layer 5 face each other. The curable resin layer 5 is released from a support 4 and transferred onto the atomic layer deposition film 2. The curable resin layer 5 is cured through application of heat or an active energy beam 29, so that an overcoat layer 3 is formed, to thereby form a gas barrier film 10.

The curable resin layer 5 is required to be ten or more times thicker than the atomic layer deposition film 2 so as to fully protect it from external mechanical stresses and thus to prevent its gas barrier properties from being impaired. If, however, the curable resin layer 5 is too thick, curing shrinkage exerts excessive stresses on the atomic layer deposition film 2, possibly leading to defects therein. Accordingly, the curable resin layer 5 is preferably 200 or less times thicker than the atomic layer deposition film 2.

The curable resin layer 5 is required to conform well and thus to be uniformly transferred onto a surface of the atomic layer deposition film 2, while preventing damage to the atomic layer deposition film 2. Accordingly, the Martens hardness of the curable resin layer 5 is preferably 50 $N/mm^2$ or less, more preferably 30 $N/mm^2$ or less.

The material constituting the curable resin layer 5 is selected from any curable resin that can be cured through application of heat, UV, or an electron beam after being transferred, and that can be adjusted to have a Martens hardness of 50 $N/mm^2$ or less.

In the case of polyurethane, for example, the material can be selected as a base resin from polyester polyol, polycarbonate polyol, polyether polyol, polycaprolactone polyol, epoxy polyol, acryl polyol, and the like. As a curing agent, polyisocyanate can be selected. Polyisocyanate may be an adduct, biuret, or isocyanate, and, if necessary, may contain an initiator, stabilizer, or the like.

The curable resin layer 5, a mixture of such materials, is formed on the support 4 described later by a coating operation. As described above, a ratio of the materials constituting the mixture needs to be adjusted to allow the curable resin layer 5 to have a Martens hardness of 50 N/mm$^2$ or less. As the base resin, polyurea or epoxy resin may be used other than polyurethane.

After an atomic layer deposition film 2 of a laminate 11 is formed on a plastic substrate 1, a curable resin layer 5 may be transferred onto the atomic layer deposition film 2 in-line in a film deposition apparatus for forming an atomic layer deposition film. In that case, the curable resin layer 5 is required to contain no solvent because the process is performed in a vacuum. In the production of an overcoat laminate 12, a curable resin layer 5 formed on a support 4 by a coating operation may contain a solvent, or a solvent may remain. In that case, the process requires a step of previously removing a solvent.

A support 4 is released from a curable resin layer 5 transferred onto an atomic layer deposition film 2 of a laminate 11. Then, a step of curing the curable resin layer 5 is performed. At this step, the curable resin layer 5 is cured by a curing section 28 applying heat, UV, or an electron beam, depending on the cure properties of the resin, to thereby form an overcoat layer 3.

If the curing step is performed in-line, an overcoat layer 3 is formed following the process for forming an atomic layer deposition film. This roll-to-roll system enables the efficient production of a gas barrier film.

The curable resin layer 5 is formed on the support 4 by a coating operation. Accordingly, the support 4 should have good wettability to resin and be peelable from a curable resin layer 5 transferred onto the atomic layer deposition film 2 or from a cured overcoat layer 3. As the support 4, a usable plastic film may be formed of polyester such as polyethylene terephthalate (PET) and polyethylene naphthalate (PEN), polyolefin such as polyethylene (PE) and polypropylene (PP), or polyethersulfone (PES). Considering heat resistance, dimensional stability, and the like, biaxially oriented polyethylene terephthalate (PET) is preferable.

In order to allow the support 4 to be easily peeled from a curable resin layer 5 transferred onto an atomic layer deposition film 2 or from a cured overcoat layer 3, an easily peelable layer (not shown) may be disposed between the support 4 and the curable resin layer 5 or the overcoat layer 3. Further, a surface of the support 4 may be subjected to corona treatment, plasma treatment, or the like.

The overcoat laminate 12 may include an antiblocking layer (not shown) formed on the opposite surface of the surface on which the curable resin layer 5 of the support 4 is formed by a coating operation. The antiblocking layer prevents blocking that would otherwise occur during winding of the overcoat laminate 12.

Preferably, the support 4 has a thickness of 12 µm or more to 100 µm or less. If the support 4 is too thin, its mechanical strength may be insufficient to support the curable resin layer 5. If the support 4 is too thick, on the other hand, and when the curable resin layer 5 is cured with the support 4 laminated thereto, heat, UV, or an electron beam may be interrupted by the support 4. Further, the rigidity of the support 4 increases, which in turn requires greater force to peel it, resulting in poor peelability.

An overcoat layer 3, which is a cured curable resin layer 5, preferably has a Martens hardness of 100 N/mm$^2$ or more to 300 N/mm$^2$ or less. An overcoat layer 3 with a Martens hardness of less than 100 N/mm$^2$ is vulnerable to external mechanical stresses, and thus cannot protect an atomic layer deposition film 2. An overcoat layer 3 with a Martens hardness of more than 300 N/mm$^2$ has a larger curing shrinkage. The increased curing shrinkage allows the atomic layer deposition film 2 to be subjected to excessive stresses. This may result in defects therein, impairing the gas barrier properties and reducing adhesion to the atomic layer deposition film 2.

Martens hardness, a value indicating the hardness of a material, can be measured using nanoindentation. Martens hardness, which is a scratch hardness, is represented by a load required to produce a scratch of width 0.01 mm created in a surface of a sample. The scratch is created with a pyramidal diamond whose angle between two opposite faces is 90 degrees.

The gas barrier film of the present invention and the method of producing the same will now be described in connection with an Example and Comparative Examples described in detail. Note that the present invention is not limited to the following Examples.

The Example and Comparative Examples will be described.

EXAMPLES

<Production of Laminate 11 (Gas Barrier Laminate) Including Atomic Layer Deposition Film 2>

As a plastic substrate 1, a polyethylene terephthalate (PET) film 50 µm thick was used.

On the PET film, TiO$_2$ was deposited as an atomic layer deposition film 2 to a thickness of 25 nm. In this process, titanium tetrachloride (TiCl$_4$) as a source gas (first precursor), O$_2$ and N$_2$ both as a process gas and purge gas, O$_2$ as a reactant gas (second precursor) and plasma discharge gas, were supplied to a vacuum chamber.

A plasma excitation power supply at 13.56 MHz was used to perform plasma discharge (250 W) in inductively coupled plasma (ICP) mode, to form a laminate 11 including an atomic layer deposition film 2.

<Production of Overcoat Laminate 12>

As a support 4, a polyethylene terephthalate (PET) film 50 µm thick was used. After an easily peelable layer containing fluorine was disposed on the PET film, polycarbonate polyol and hexamethylene diisocyanate were mixed so as to become 0.5 equivalents thereof, and were diluted with methyl ethyl ketone. A UV-curable resin produced was coated onto a surface of the easily peelable layer of the support 4 using a bar coater to form a layer having a thickness of 2.5 µm. The product was dried for 1 minute at 80° C., to form an overcoat laminate 12.

Example 1

A laminate 11 and overcoat laminate 12 were produced as described above. The overcoat laminate 12 was laminated to the laminate 11 so that the atomic layer deposition film 2 faced the UV-curable resin (curable resin layer 5). The UV-curable resin layer was irradiated with 0.7 J/m$^2$ of UV from the support 4 side, and the support 4 was released, to form a gas barrier film 10 including the plastic substrate 1, atomic layer deposition film 2, and overcoat layer 3.

Comparative Example 1

A gas barrier film was formed with no overcoat layer 3 formed on a laminate 11 similar to that of Example 1.

Comparative Example 2

A curable resin was coated with a bar coater on an atomic layer deposition film 2 of a laminate 11 similar to that of Example 1, followed by drying and curing, to form a gas barrier film including a plastic substrate, atomic layer deposition film, and overcoat layer.

<Evaluation Method>

An AQUATRAN (product name) from MOCON was used to measure the initial moisture vapor transmission rate of the gas barrier films of Example 1, Comparative Example 1, and Comparative Example 2. Further, the samples were subjected to compressive stresses of 6 MPa in a direction perpendicular to the surfaces of equivalents thereof, following which their moisture vapor transmission rates were measured.

Table 1 shows the measurements of the respective moisture vapor transmission rates.

TABLE 1

| | INITIAL MOISTURE VAPOR TRANSMISSION RATE [g/(m² · day)] | |
|---|---|---|
| | INITIAL RATE | RATE AFTER COMPRESSION |
| EXAMPLE 1 | 0.0028 | 0.0031 |
| COMPARATIVE EXAMPLE 1 | 0.0025 | 0.5384 |
| COMPARATIVE EXAMPLE 2 | 0.0711 | 0.0796 |

As can be seen from Table 1, the moisture vapor transmission rate of the gas barrier film of Example 1 hardly deteriorated after being subjected to external mechanical stresses. There was a sharp deterioration in moisture vapor transmission rate in the gas barrier film of Comparative Example 1 without an overcoat layer. This result shows the vulnerability of the atomic layer deposition film, and confirms the function of the overcoat layer as a protective layer. Before being subjected to external mechanical stresses, the overcoat layer of Comparative Example 2, which was formed on the atomic layer deposition film by direct coating, had a moisture vapor transmission rate much poorer than that of Example 1. The atomic layer deposition film, which has high gas barrier properties, suffers damage when subjected to external mechanical stresses during production, processing, or the like. It was confirmed that the method of the present invention of forming an overcoat layer through a transfer process is effective.

INDUSTRIAL APPLICABILITY

The present invention is applicable to a gas barrier film and a method of producing the same. In particular, the invention is applicable to, for example, electronic devices such as LCDs, organic ELDs, OEL lighting devices, organic solar cells, and semiconductor wafers, packaging films for pharmaceuticals, foods, precision parts, or the like.

REFERENCE SIGNS LIST

1 . . . Plastic substrate
2 . . . Atomic layer deposition film
3 . . . Overcoat layer
4 . . . Support
5 . . . Curable resin layer
10 . . . Gas barrier film
11 . . . Laminate
12 . . . Overcoat laminate
20 . . . Film deposition apparatus for forming atomic layer deposition film
21 . . . First vacuum chamber
22 . . . Second vacuum chamber
23 . . . Third vacuum chamber
24 . . . Conveyor mechanism
25 . . . Roll-out section
26 . . . Take-up section
27 . . . Vacuum pump
28 . . . Curing section
29 . . . Heat or active energy beam

What is claimed is:

1. A method of manufacturing a rollable gas barrier film, comprising:
    forming a rollable gas barrier laminate by depositing an atomic layer deposition film on a surface of a rollable plastic substrate using atomic layer deposition, the rollable gas barrier laminate consists of the atomic layer deposition film and the substrate;
    forming a rollable overcoat laminate by depositing an uncured curable resin layer on a support, the uncured curable resin layer comprises (a) a base resin selected from polyester polyol, polycarbonate polyol, polyether polyol, polycaprolactone polyol, epoxy polyol, and acryl polyol and (b) a polyisocyanate curing agent;
    contacting the rollable gas barrier laminate and the rollable overcoat laminate with the atomic layer deposition film and the uncured curable resin layer facing each other, and laminating the overcoat laminate to gas barrier laminate;
    curing the uncured curable resin layer through application of UV-light; and releasing the cured resin layer from the support, wherein the curing forms a cured polyurethane resin layer, wherein said releasing forms a rollable gas barrier film consisting of the substrate, the atomic layer deposition film and the cured polyurethane resin layer, wherein the uncured curable resin layer has a Martens hardness of 30 N/mm² or less; wherein the cured polyurethane resin layer has a Martens hardness of 100 N/mm² to 300 N/mm², and wherein the uncured curable resin layer has a thickness of at least 10 times to 200 times of a thickness of the atomic layer deposition film.

2. The method of manufacturing a gas barrier film of claim 1, wherein the overcoat laminate further comprises an antiblocking layer formed on the opposite surface of the surface on which the uncured curable resin layer of the support is formed by a coating operation.

3. The method of manufacturing a gas barrier film of claim 1, wherein the support has a thickness of about 12 μm or more to about 100 μm or less.

4. The method of manufacturing a gas barrier film of claim 1, wherein the atomic layer deposition film is a TiO₂ atomic layer deposition film.

5. The method of manufacturing a gas barrier film of claim 4, wherein the atomic layer deposition film has the thickness from 10 nm to 500 nm.

6. The method of manufacturing a gas barrier film of claim 4, wherein the atomic layer deposition film has the thickness from 10 nm to 25 nm.

7. The method of manufacturing a gas barrier film of claim 4, wherein the atomic layer deposition film has the thickness of about 25 nm.

8. The method of claim 1, wherein the base resin is acryl polyol.

9. The method of claim 1, wherein the base resin is polycarbonate polyol.

10. The method of claim 1, wherein said depositing the atomic layer deposition film comprises adsorbing a first precursor on a surface of the rollable substrate, purging an excess of the first precursor from the surface of the rollable substrate, exposing the first precursor adsorbed on the surface of the rollable substrate to a second precursor to react the first precursor with the second precursor and purging an excess of the second precursor from the surface of the rollable substrate.

11. The method of claim 10, wherein said depositing the atomic layer deposition film is performed in a deposition apparatus comprising a first vacuum chamber, a second vacuum chamber, a third vacuum chamber and a conveyor, wherein said depositing the atomic layer deposition film comprises transporting the rollable substrate through each of the first vacuum chamber, the second vacuum chamber and the third vacuum chamber by the conveyor multiple times, wherein the adsorbing the first precursor is performed in the first vacuum chamber; the exposing the first precursor adsorbed on the surface of the rollable substrate to the second precursor is performed in the second vacuum chamber; and the purging the excess of the first precursor and the purging the excess of the second precursor are performed in the third vacuum chamber.

12. A method of manufacturing a rollable gas barrier film, comprising:
forming a rollable gas barrier laminate by depositing an atomic layer deposition film on a surface of a rollable plastic substrate using atomic layer deposition, the rollable gas barrier laminate consists of the atomic layer deposition film and the substrate;
forming a rollable overcoat laminate by depositing an uncured curable resin layer on a support, the uncured curable resin layer comprises (a) a base resin selected from polyester polyol, polycarbonate polyol, polyether polyol, polycaprolactone polyol, epoxy polyol, and acryl polyol and (b) a polyisocyanate curing agent;
contacting the rollable gas barrier laminate and the rollable overcoat laminate with the atomic layer deposition film and the uncured curable resin layer facing each other, and laminating the overcoat laminate to gas barrier laminate;
releasing the uncured curable resin layer from the support and then curing the uncured curable resin layer through application of UV-light; wherein the curing forms a cured polyurethane resin layer, wherein said releasing and curing form a rollable gas barrier film consisting of the substrate, the atomic layer deposition film and the cured polyurethane resin layer, wherein the uncured curable resin layer has a Martens hardness of 30 N/mm$^2$ or less; wherein the cured polyurethane resin layer has a Martens hardness of 100 N/mm$^2$ to 300 N/mm$^2$, and wherein the uncured curable resin layer has a thickness of at least 10 times to 200 times of a thickness of the atomic layer deposition film.

* * * * *